United States Patent
Park et al.

(10) Patent No.: US 10,034,369 B2
(45) Date of Patent: Jul. 24, 2018

(54) DISPLAY APPARATUS

(71) Applicant: Samsung Display Co., LTD., Yongin-si, Gyeonggi-Do (KR)

(72) Inventors: Sung-Dong Park, Asan-si (KR); Sang-Hwan Lee, Asan-si (KR); Jae-Hwan Jeon, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 32 days.

(21) Appl. No.: 15/000,595

(22) Filed: Jan. 19, 2016

(65) Prior Publication Data

US 2016/0379587 A1  Dec. 29, 2016

(30) Foreign Application Priority Data

Jun. 29, 2015  (KR) .......................... 10-2015-0092387

(51) Int. Cl.
*H05K 1/02* (2006.01)
*H01L 23/498* (2006.01)
*G09G 3/36* (2006.01)
*G02F 1/133* (2006.01)

(52) U.S. Cl.
CPC ............. *H05K 1/028* (2013.01); *G02F 1/133* (2013.01); *G09G 3/3611* (2013.01); *G09G 2300/0426* (2013.01); *G09G 2310/0281* (2013.01); *H01L 23/4985* (2013.01)

(58) Field of Classification Search
CPC .. H05K 1/028; H01L 23/4985; G09G 3/3611; G09G 2310/0281; G09G 2300/0426; G02F 1/133
See application file for complete search history.

(56) References Cited

U.S. PATENT DOCUMENTS

2012/0075268 A1*  3/2012  Chung ................ G02F 1/13452
                                                          345/204
2015/0311148 A1*  10/2015  Jung ................... H01L 23/4985
                                                            361/767

FOREIGN PATENT DOCUMENTS

KR    1020080058840 A    6/2008

* cited by examiner

*Primary Examiner* — Amr Awad
*Assistant Examiner* — Andre Matthews
(74) *Attorney, Agent, or Firm* — Cantor Colburn LLP

(57) ABSTRACT

A display apparatus includes a display panel including a first substrate and a second substrate opposite to the first substrate, the first substrate including a switching element and a pixel electrode electrically connected to the switching element, and a display panel driver including a gate driver which outputs a gate signal to a gate line of the display panel, the gate line electrically connected to the switching element and extending in a first direction, and a data driver which outputs a data signal to a data line of the display panel and including data driving chips, the data line electrically connected to the switching element and extending in a second direction crossing the first direction, where each of the data driving chips includes a chip body, and a stress reliever extending from the chip body in a direction having an acute angle to the first and second directions.

18 Claims, 16 Drawing Sheets

FIG. 3
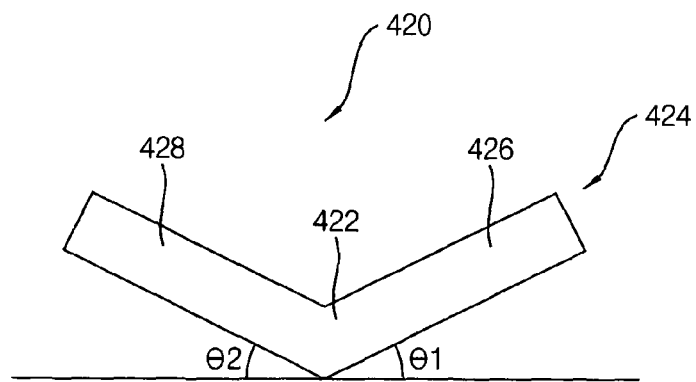
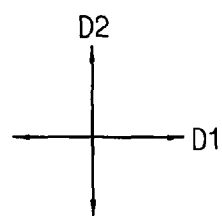
FIG. 4
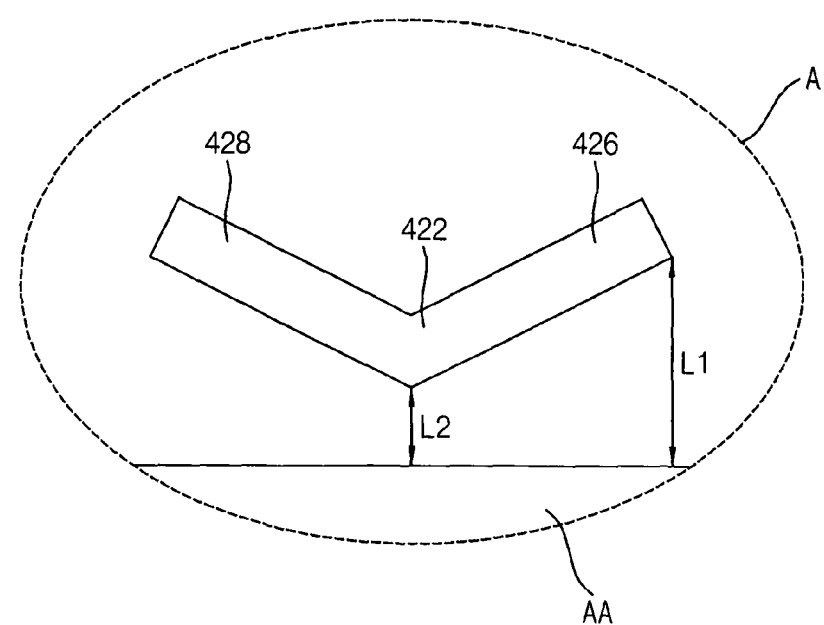

FIG. 7
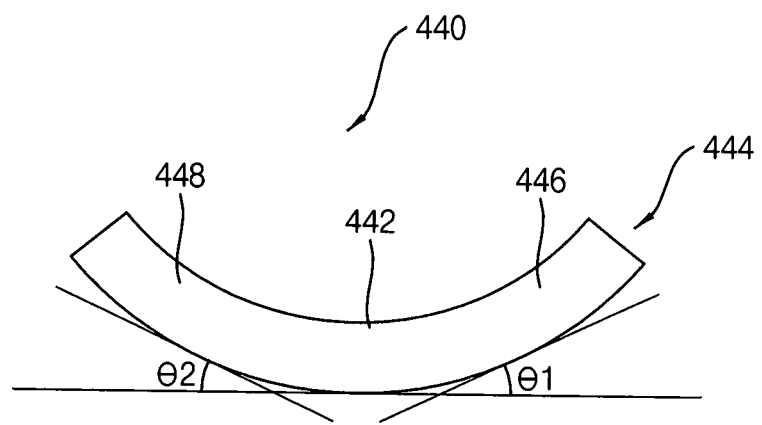
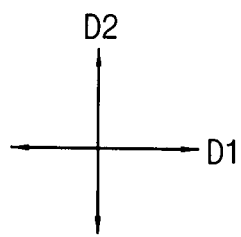

FIG. 13
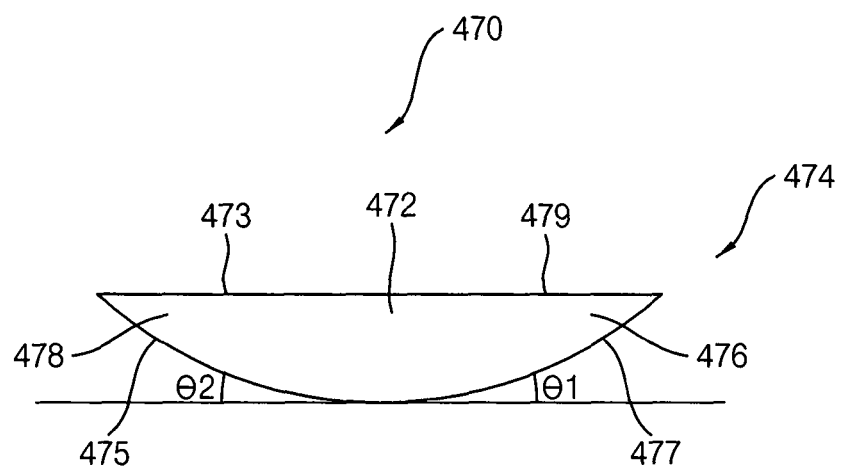
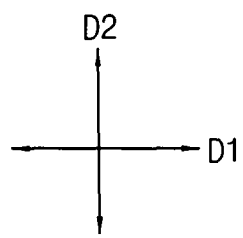

DISPLAY APPARATUS

This application claims priority to Korean Patent Application No. 10-2015-0092387, filed on Jun. 29, 2015, and all the benefits accruing therefrom under 35 U.S.C. § 119, the content of which in its entirety is herein incorporated by reference.

BACKGROUND

1. Field

Exemplary embodiments relate to a display apparatus. More particularly, exemplary embodiments relate to a display apparatus including a driving chip to output a driving signal.

2. Description of the Related Art

A display apparatus includes a display panel and a display panel driver. The display panel generally includes an active region to display an image and a peripheral region disposed around the active region. In addition, the display panel driver includes a gate driver and a data driver. The data driver includes a plurality of data driving chips.

Each of the data driving chips may be mounted on the peripheral region of the display panel.

SUMMARY

When a thermal compression process is performed to mount each of the data driving chips on the peripheral region of the display panel, the active region of the display panel may be deteriorated and a light leakage problem may occur due to a heat and a pressure by the thermal compression process.

In addition, when the data driving chips are spaced apart from the active region of the display panel in order to reduce the light leakage problem, the peripheral region and a bezel of the display panel may be broader.

Accordingly, the invention is provided to substantially obviate one or more problems due to limitations and disadvantages of the related art.

Exemplary embodiments provide a display apparatus capable of reducing a light leakage problem and having a narrow bezel.

According to exemplary embodiments, a display apparatus includes a display panel and a display panel driver. The display panel includes a first substrate and a second substrate opposite to the first substrate. The first substrate includes a switching element and a pixel electrode electrically connected to the switching element. The display panel driver includes a gate driver and a data driver. The gate driver outputs a gate signal to a gate line of the display panel. The gate line is electrically connected to the switching element. The gate line extends in a first direction. The data driver outputs a data signal to a data line of the display panel. The data driver includes a plurality of a data driving chips. The data line is electrically connected to the switching element. The data line extends in a second direction crossing the first direction. Each of the data driving chips includes a chip body and a stress reliever. The stress reliever extends from the chip body in a direction. The direction is an acute angle to the first and second directions.

In exemplary embodiments, the stress reliever may include a first extension portion extending from a first end of the chip body in a first angle and a second extension portion extending from a second end of the chip body in a second angle.

In exemplary embodiments, each of first ends of the first and second extension portions may be connected to the chip body. The display panel may include an active region in which the gate line and the data line are disposed and a peripheral region in which the data driving chips are disposed. A distance between each of second ends of the first and second extension portions and the active region of the display panel may be greater than a distance between each of the first ends of the first and second extension portions and the active region of the display panel.

In exemplary embodiments, each of the data driving chips may have a V shape.

In exemplary embodiments, each of the data driving chips may have a U shape.

In exemplary embodiments, the first and second extension portions may be substantially symmetric with respect to the chip body.

In exemplary embodiments, the chip body may extend in the first direction.

In exemplary embodiments, the display panel may include an active region in which the gate line and the data line are disposed and a peripheral region in which the data driving chips are disposed. Each of first surfaces of the first and second extension portions may face the active region of the display panel. Each of the first surfaces of the first and second extension portions may extend in a direction. The direction may be an acute angle to the first and second directions. Each of second surfaces of the first and second extension portions may be opposite to each of the first surfaces of the first and second extension portions. Each of the second surfaces of the first and second extension portions may be substantially parallel with the first direction.

In exemplary embodiments, each of the data driving chips may have a shape that portions of two adjacent corners of a rectangle are removed In exemplary embodiments, each of the data driving chips may have a triangle shape.

In exemplary embodiments, each of the data driving chips may have a semicircle shape.

In exemplary embodiments, the stress reliever may further include a third extension portion extending from the first extension portion in a third angle and a fourth extension portion extending from the second extension portions in a fourth angle. Each of the third and fourth angles may be different from each of the first and second angles.

In exemplary embodiments, each of the third and fourth angles may be greater than each of the first and second angles with respect to the first direction.

In exemplary embodiments, the display panel may include an active region in which the gate line and the data line are disposed and a peripheral region in which the data driving chips are disposed. Each of first ends of the third and fourth extension portions may be connected to each of the first and second extension portions. A distance between each of second ends of the third and fourth extension portions and the active region of the display panel may be greater than a distance between each of the first ends of the third and fourth extension portions and the active region of the display panel.

In exemplary embodiments, the third and fourth extension portions may be symmetric with respect to the chip body.

In exemplary embodiments, each of the data driving chips may be disposed on the first substrate.

In exemplary embodiments, the display panel driver may further include a printed circuit board ("PCB"). The data driver may further include a flexible film electrically connecting the PCB with the display panel.

In exemplary embodiments, the gate driver may include a plurality of gate driving chips. Each of the gate driving chips may include a chip body and a stress reliever extending from the chip body in a direction. The direction may be an acute to the first and second direction.

In exemplary embodiments, each of the gate driving chips may have a V shape.

In exemplary embodiments, each of the gate driving chips may have a U shape.

According to the display apparatus, when a thermal compression process is performed to mount the data driving chips on the peripheral region of the display panel, defects of the display panel by a heat and a pressure generated by the thermal compression process may be reduced. In an exemplary embodiment, a light leakage problem generated by the thermal compression process may be reduced.

Because each of the data driving chips includes the stress reliever extending in a direction, the direction which may be an acute angle to the first and second directions, a surface of each of the data driving chips facing the active region of the display panel. A stress by the thermal compression process may be moderated and the defects by the thermal compression process may be reduced.

In addition, because each of the data driving chips may be mounted close to the active region of the display panel, a bezel of the display apparatus may become narrow.

BRIEF DESCRIPTION OF THE DRAWINGS

Illustrative, non-limiting exemplary embodiments will be more clearly understood from the following detailed description taken in conjunction with the accompanying drawings.

FIG. 1 is a plan view illustrating exemplary embodiments of a display apparatus according to.

FIG. 3 is a plan view illustrating a data driving chip of FIG. 1.

FIG. 4 is an enlarged plan view illustrating "A" region of FIG. 1.

FIG. 7 is a plan view illustrating a data driving chip of FIG. 6.

FIG. 13 is a plan view illustrating a data driving chip of FIG. 12.

DETAILED DESCRIPTION

Figure 1:
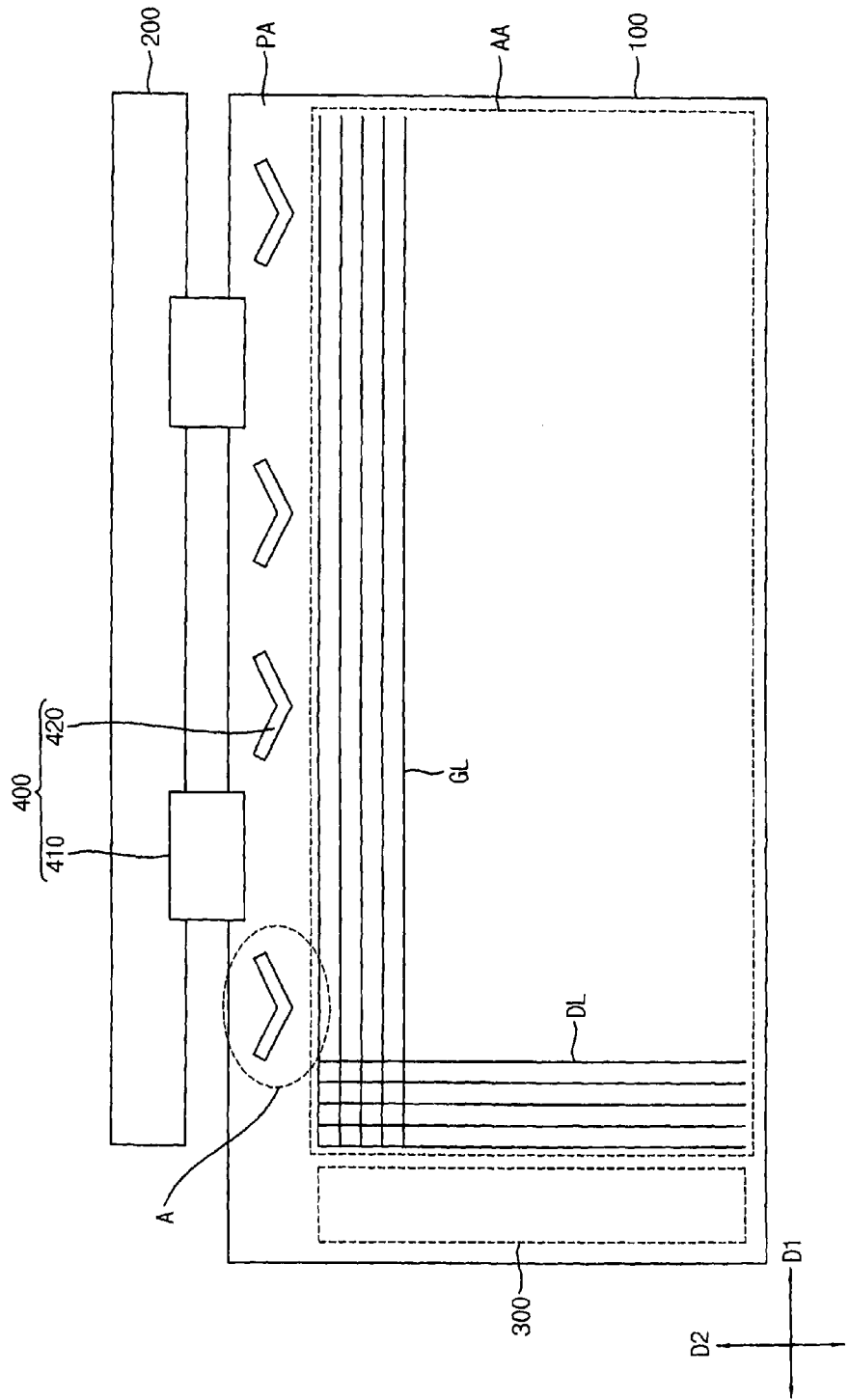

Various exemplary embodiments will be described more fully with reference to the accompanying drawings, in which embodiments are shown. This invention may, however, be embodied in many different forms and should not be construed as limited to the embodiments set forth herein. Rather, these embodiments are provided so that this invention will be thorough and complete, and will fully convey the scope of the invention to those skilled in the art. Like reference numerals refer to like elements throughout this application.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Figure 2:
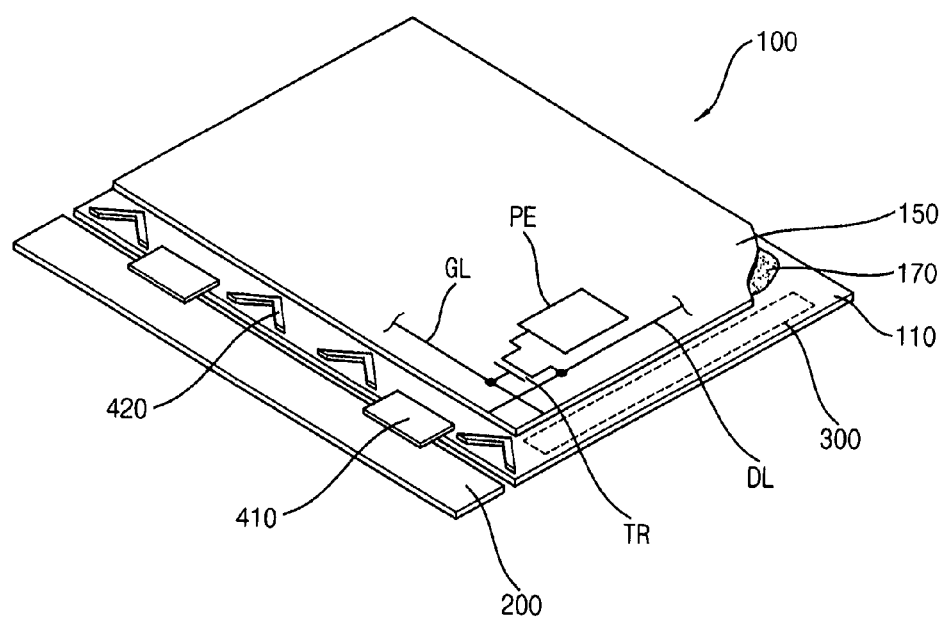
FIG. 2 is a perspective view illustrating the display apparatus of FIG. 1.

FIG. 1 is a plan view illustrating a display apparatus according to exemplary embodiments. FIG. 2 is a perspective view illustrating the display apparatus of FIG. 1. FIG. 3 is a plan view illustrating a data driving chip of FIG. 1. FIG. 4 is an enlarged plan view illustrating "A" region of FIG. 1.

Referring to FIGS. 1 to 4, a display apparatus includes a display panel 100 and a display panel driver.

The display panel 100 includes an active region AA on which an image is displayed and the peripheral region PA adjacent to the active region AA and not displaying the image. The active region AA may be also referred to as a display region.

The display panel 100 includes a plurality of gate lines GL, each of which extends a first direction D1, and a plurality of data lines DL, each of which extends a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

Each pixel includes a switching element TR, a liquid crystal capacitor (not shown) and a storage capacitor (not shown). The liquid crystal capacitor and the storage capacitor are electrically connected to the switching element TR. The pixels may be disposed in a matrix form.

The display panel 100 may include a first substrate 110 and a second substrate 150 opposite to the first substrate 110.

In an exemplary embodiment, the first substrate 110 may be an array substrate, for example. The gate lines GL and the data lines DL may be disposed on the first substrate 110. A plurality of switching elements TR connected to the gate lines GL and the data lines DL may be disposed on the first substrate 110. A pixel electrode PE may be disposed on the first substrate 110.

The second substrate 150 may be a corresponding substrate opposite to the first substrate 110. A common electrode (not shown) facing the pixel electrode PE may be disposed under the second substrate 150. A color filter defining a color of the pixel may be disposed under the second substrate 150.

An overlap area between the first substrate 110 and the second substrate 150 may be substantially the same as the active region AA of the display panel 100. In an alternative exemplary embodiment, the overlap area between the first substrate 110 and the second substrate 150 except for the area where the sealing member (not shown) is disposed may be defined to the active region AA of the display panel 100.

The display apparatus may further include a liquid crystal layer 170 interposed between the first and second substrate 110 and 150.

The display panel driver may include a gate driver 300 and a data driver 400. The display panel driver may further include a printed circuit board ("PCB") 200. A timing controller and a power voltage generator may be disposed on the PCB 200.

The data driver 400 may include a plurality of data driving chips 420. The data driver 400 may further include a data flexible film 410.

The data driving chips 420 may be disposed (e.g., mounted) on the peripheral region PA of the display panel 100. In an exemplary embodiment, the data driving chips 420 may be mounted on the peripheral region PA as a COG (chip on glass) type, for example. The data flexible film 410 may electrically connect the PCB 200 with the display panel 100.

In exemplary embodiments, the gate driver 300 may be mounted on the peripheral region PA of the display panel 100.

The timing controller receives input image data and an input control signal from an external apparatus. In an exemplary embodiment, the input image data may include red image data, green image data and blue image data, for example. In an exemplary embodiment, the input control signal may include a master clock signal and a data enable signal. In an exemplary embodiment, the input control signal may further include a vertical synchronizing signal and a horizontal synchronizing signal.

The timing controller generates a first control signal, a second control signal and a data signal based on the input image data and the input control signal.

The timing controller generates the first control signal for controlling an operation of the gate driver 300 based on the input control signal, and outputs the first control signal to the gate driver 300.

The timing controller generates the second control signal for controlling an operation of the data driver 400 based on the input control signal, and outputs the second control signal to the data driver 400.

The timing controller generates a data signal based on the input image data. The timing controller outputs the data signal to the data driver 400.

The gate driver 300 generates gate signals driving the gate lines GL in response to the first control signal received from the timing controller. The gate driver 300 sequentially outputs the gate signals to the gate lines GL.

The data driver 400 receives the second control signal and the data signal from the timing controller. The data driver 400 converts the data signal into data voltages having an analog type. The data driver 400 outputs the data voltages to the data lines DL.

The display apparatus may further include a backlight assembly (not shown) disposed under the first substrate and providing light to the display panel 100.

As illustrated in FIG. 3, each of the data driving chips 420 may include a chip body 422 and a stress reliever 424 extending from the chip body 422 in a direction, which may be an acute angle to the first and second direction D1 and D2.

The stress reliever 424 may include a first extension portion 426 and a second extension portion 428. The first extension portion 426 may extend in a first angle θ1, which may be an acute angle to the first and second directions D1 and D2. The second extension portion 428 may extend in a second angle θ2, which may be acute angle to the first and second directions D1 and D2.

In exemplary embodiments, the data driving chip 420 may have a V shape, for example. In an exemplary embodiment, the first and second extension portions 426 and 428 may be symmetric with respect to the chip body 422.

In exemplary embodiments, the chip body 422 may extend in the first direction D1.

As illustrated in FIG. 4, each of first ends of the first and second extension portions 426 and 428 may be connected to the chip body 422. A distance L1 between each of second ends of the first and second extension portions 426 and 428 and the active region AA of the display panel 100 may be greater than a distance L2 between each of the first ends of the first and second extension portions 426 and 428.

By the display apparatus according to exemplary embodiments, when a thermal compression process is performed to mount the data driving chip 420 on the peripheral region PA of the display panel 100, defects at a portion of the active regions AA of the display panel 100 adjacent to each of the second ends of the first and second extension portions 426 and 428 may be reduced. In an exemplary embodiment, a light leakage problem at the active region AA of the display panel 100 generated by the thermal compression process may be reduced, for example.

Because a stress generated by the thermal compression process is applied to a portion of the active region AA of the display panel 100 adjacent to the second ends of the first and second extension portions 426 and 428, the first and second extension portions 426 and 428 may be substantially spaced apart from the active region AA of the display panel 100, and the data driving chip 420 may be positioned to be close to the active region AA of the display panel 100, simultaneously.

Figure 5:
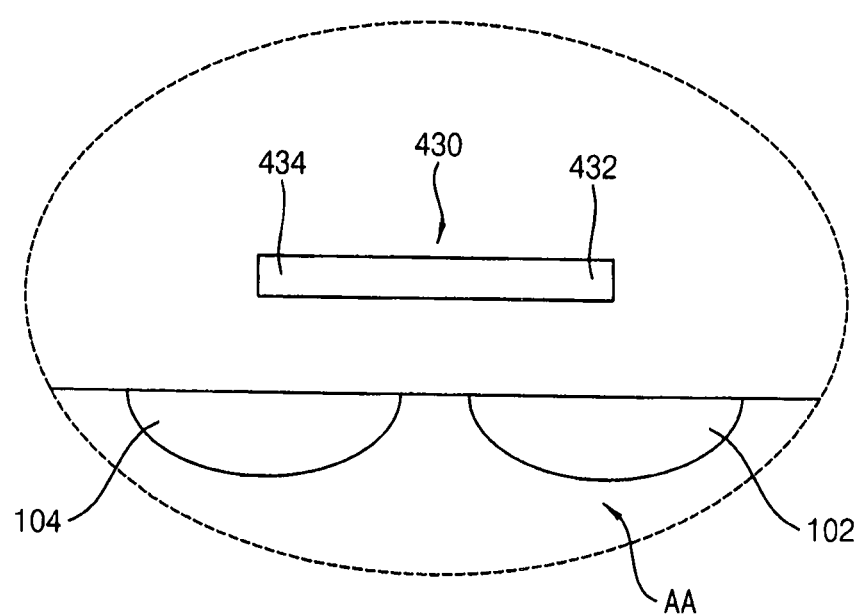
FIG. 5 is a plan view illustrating a data driving chip according to a comparative example.

FIG. 5 is a plan view illustrating a data driving chip according to a comparative example.

Referring to FIG. 5, when a data driving chip 430 according to a comparative example is mounted on a peripheral region of a display panel by the thermal compression process, a stress by the thermal compression process may be applied to each of portions 102 and 104 of an active region AA of the display panel adjacent to each of a first end 432 and a second end 434 of the data driving chip.

The light leakage problem by the stress may occur at the active region AA of the display panel, and when the conventional data driving chip 430 is spaced further apart from the active region AA of the display panel to reduce the stress, a bezel of the display panel may be broader.

According to the display apparatus in accordance with exemplary embodiments, a size of the peripheral region PA of the display panel 100 may be reduced and a bezel of the display apparatus may become narrow.

Figure 6:
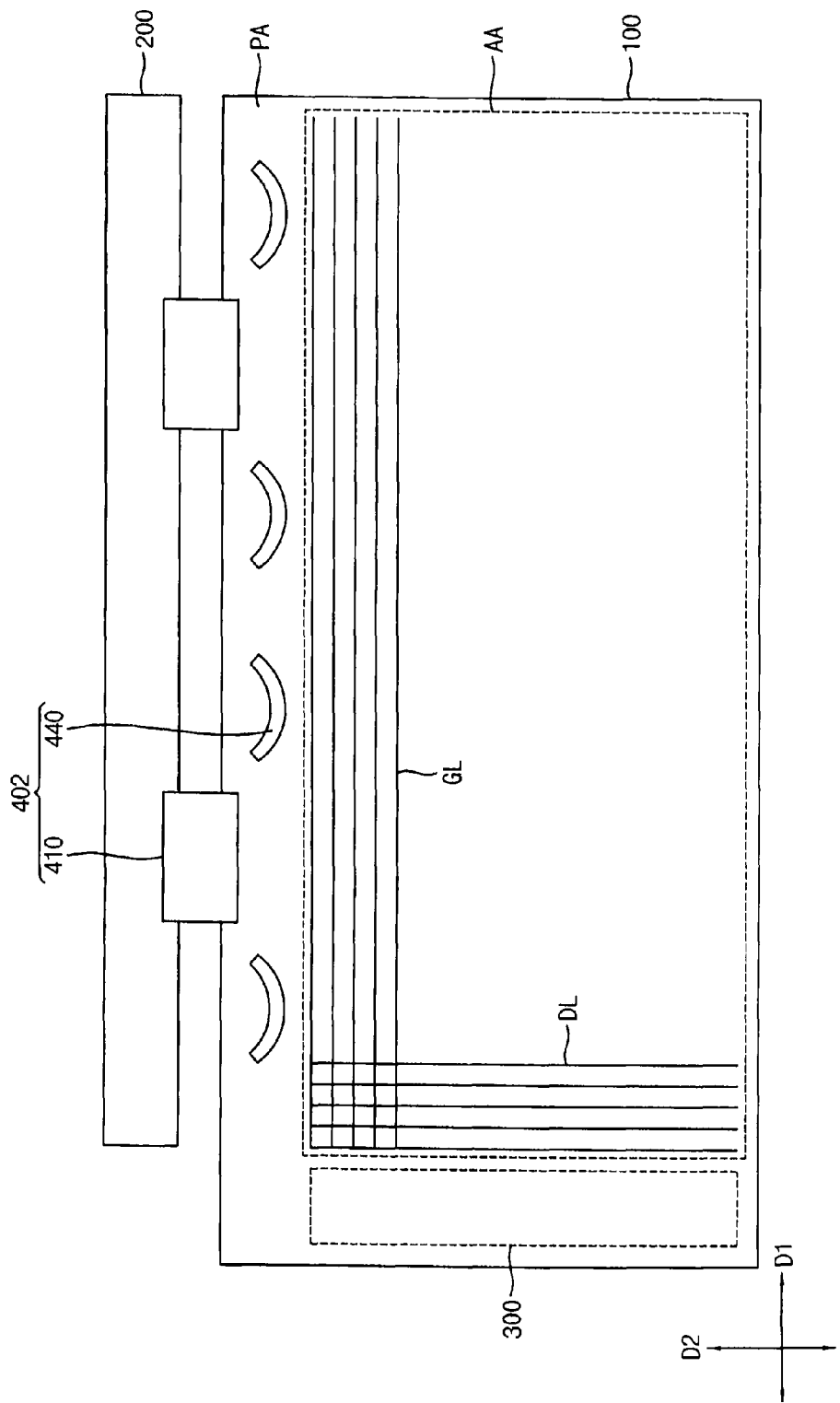
FIG. 6 is a plan view illustrating exemplary embodiments of a display apparatus according to the invention.

FIG. 6 is a plan view illustrating a display apparatus according to exemplary embodiments. FIG. 7 is a plan view illustrating a data driving chip of FIG. 6. The display apparatus may be substantially the same as that of FIGS. 1 to 4, except for a shape of each of first and second extension portions. Thus like reference numerals refer to like elements, and repetitive explanations thereon may be omitted herein.

Referring to FIGS. 6 and 7, a display apparatus includes a display panel 100 and a display panel driver.

The display panel 100 includes an active region AA on which an image is displayed and the peripheral region PA adjacent to the active region AA and not displaying the image. The active region AA may be also referred to as a display region.

The display panel 100 includes a plurality of gate lines GL, each of which extends a first direction D1 and a plurality of data lines DL, a each of which extends a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

The display panel driver may include a gate driver 300 and a data driver 402. The display panel driver may further include a PCB 200. A timing controller and a power voltage generator may be disposed on the PCB 200.

The data driver 402 may include a plurality of data driving chips 440. The data driver 402 may further include a data flexible film 410.

The data driving chips 440 may be mounted on the peripheral region PA of the display panel 100. In an exemplary embodiment, the data driving chips 420 may be mounted on the peripheral region PA as a COG (chip on glass) type, for example. The data flexible film 410 may electrically connect the PCB 200 with the display panel 100.

In exemplary embodiments, the gate driver 300 may be mounted on the peripheral region PA of the display panel 100.

As illustrated in FIG. 7, each of the data driving chips 440 may include a chip body 442 and a stress reliever 444 extending from the chip body 442 in a direction, which may be an acute angle to the first and second direction D1 and D2.

The stress reliever 444 may include a first extension portion 446 and a second extension portion 448. A tangent line of the first extension portion 446 may have a first angle θ1, which may be an acute angle to the first and second directions D1 and D2. A tangent line of the second extension portion 448 may have a second angle θ2, which may be acute angle to the first and second directions D1 and D2.

In exemplary embodiments, the data driving chip 440 may have a U shape. In addition, the first and second extension portions 446 and 448 may be symmetric with respect to the chip body 442.

In exemplary embodiments, the chip body 442 may extend in the first direction.

By the display apparatus according to exemplary embodiments, when a thermal compression process is performed to mount the data driving chip 440 on the peripheral region PA of the display panel 100, defects at a portion of the active regions AA of the display panel 100 adjacent to each of ends of the first and second extension portions 446 and 448 may be reduced. In an exemplary embodiment, a light leakage problem at the active region AA of the display panel 100 generated by the thermal compression process may be reduced, for example.

Because a stress generated by the thermal compression process is applied to a portion of the active region AA of the display panel 100 adjacent to the ends of the first and second extension portions 446 and 448, the first and second extension portions 446 and 448 may be substantially spaced apart from the active region AA of the display panel 100, and the data driving chip 440 may be positioned to be close to the active region AA of the display panel 100, simultaneously. A bezel of the display panel 100 may become narrow.

Figure 8:
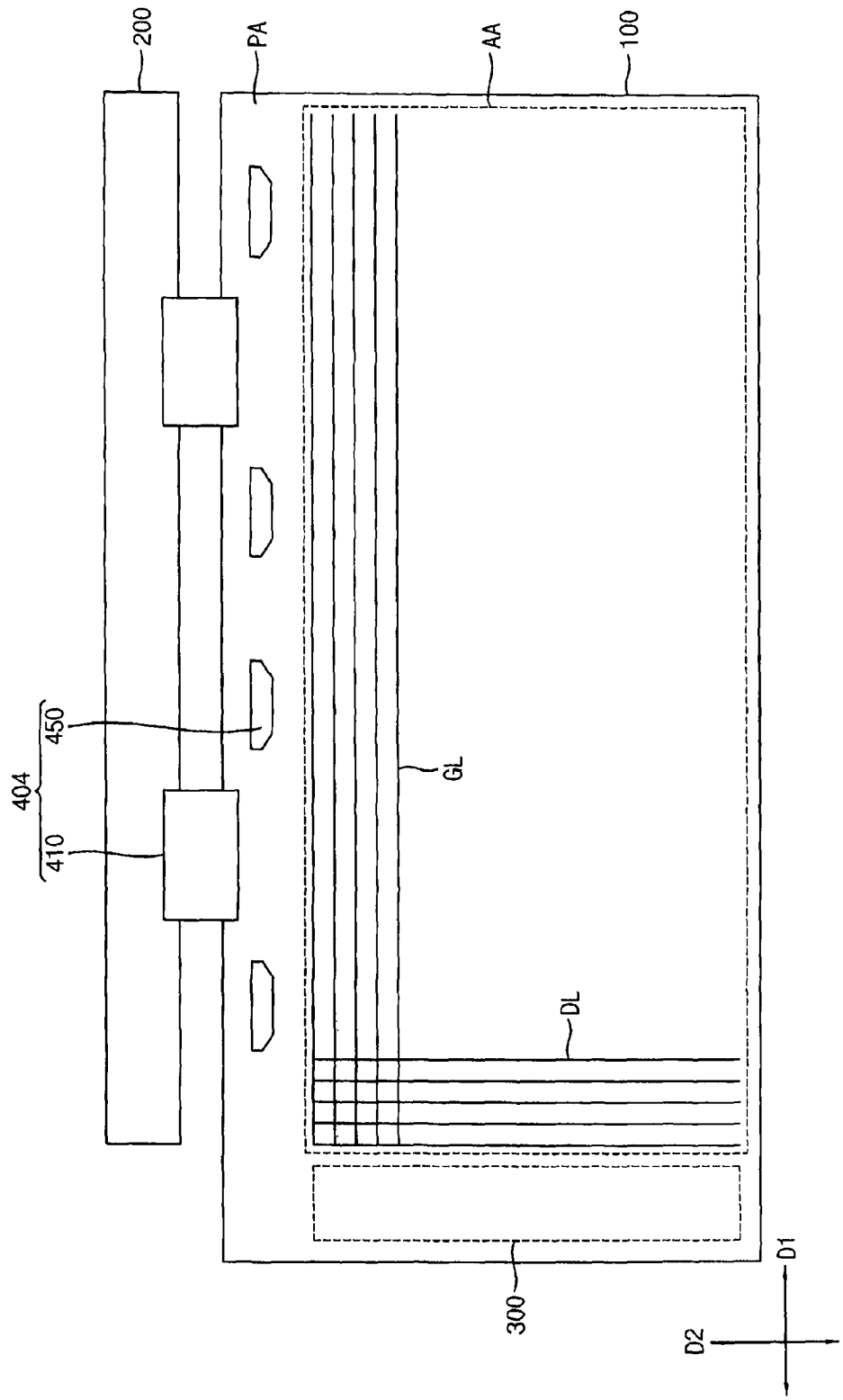
FIG. 8 is a plan view illustrating exemplary embodiments of a display apparatus according to the invention.
Figure 9:
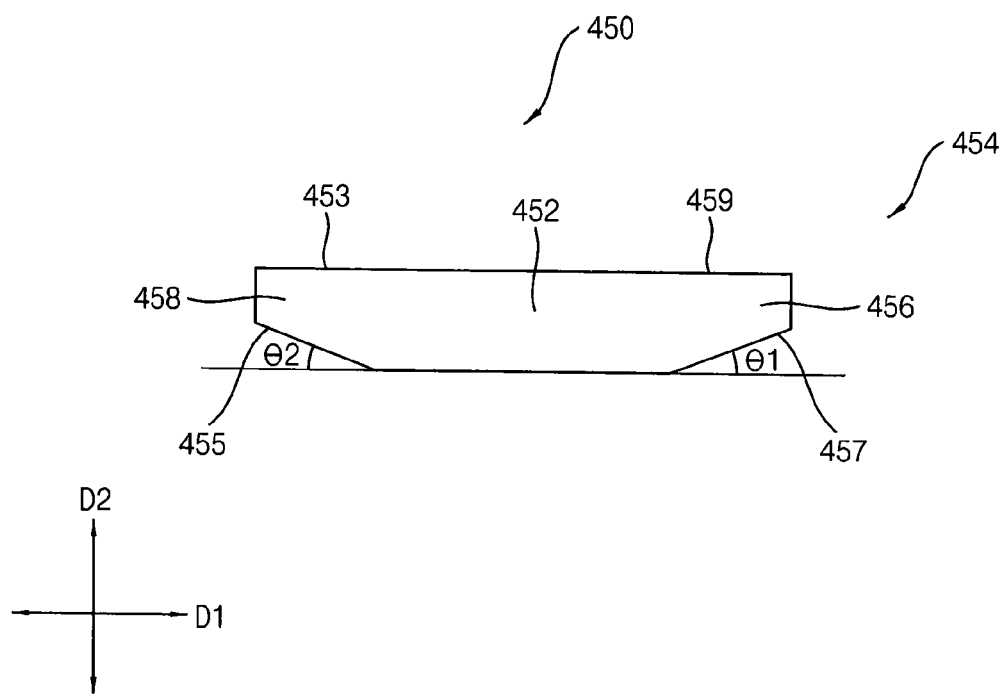
FIG. 9 is a plan view illustrating a data driving chip of FIG. 8.

FIG. 8 is a plan view illustrating a display apparatus according to exemplary embodiments. FIG. 9 is a plan view illustrating a data driving chip of FIG. 8. The display apparatus may be substantially the same as that of FIGS. 1 to 4, except for a shape of each of first and second extension portions. Thus like reference numerals refer to like elements, and repetitive explanations thereon may be omitted herein.

Referring to FIGS. 8 and 9, a display apparatus includes a display panel 100 and a display panel driver.

The display panel 100 includes an active region AA on which an image is displayed and the peripheral region PA adjacent to the active region AA and not displaying the image. The active region AA may be also referred to as a display region.

The display panel 100 includes a plurality of gate lines GL, each of which extends a first direction D1 and a plurality of data lines DL, a each of which extends a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

The display panel driver may include a gate driver 300 and a data driver 404. The display panel driver may further include a PCB 200. A timing controller and a power voltage generator may be disposed on the PCB 200.

The data driver 404 may include a plurality of data driving chips 450. The data driver 404 may further include a data flexible film 410.

The data driving chips 450 may be mounted on the peripheral region PA of the display panel 100. In an exemplary embodiment, the data driving chips 450 may be mounted on the peripheral region PA as a COG (chip on glass) type, for example. The data flexible film 410 may electrically connect the PCB 200 with the display panel 100.

In exemplary embodiments, the gate driver 300 may be mounted on the peripheral region PA of the display panel 100.

As illustrated in FIG. 9, each of the data driving chips 450 may include a chip body 452 and a stress reliever 454 extending from the chip body 452 in a direction, which may be an acute angle to the first and second direction D1 and D2.

The stress reliever 454 may include a first extension portion 456 and a second extension portion 458. A side (e.g., a lower side) of the first extension portion 456 may extend in a first angle θ1, which may be an acute angle to the first and second directions D1 and D2. A side (e.g., a lower side) of the second extension portion 458 may extend in a second angle θ2, which may be acute angle to the first and second directions D1 and D2.

In exemplary embodiments, each of first surfaces 457 and 455 of the first and second extension portions 456 and 458 may face the active region AA of the display panel 100. Each of the first surfaces 457 and 455 of the first and second extension portions 456 and 458 may extend in a direction, the direction which is an acute angle to the first and second directions D1 and D2. Each of second surfaces 459 and 453 of the first and second extension portions 456 and 458 may be opposite to each of the first surfaces 457 and 455 of the first and second extension portions 456 and 458, and each of the second surfaces 459 and 453 of the first and second extension portions 456 and 458 may be substantially parallel with the first direction D1.

In an exemplary embodiment, each of the data driving chips 450 may have a shape that portions of two adjacent corners of a rectangle are removed.

In addition, the first and second extension portions 456 and 458 may be symmetric with respect to the chip body 452.

In exemplary embodiments, the chip body 452 may extend in the first direction D1.

By the display apparatus according to exemplary embodiments, when a thermal compression process is performed to mount the data driving chip 450 on the peripheral region PA of the display panel 100, defects at a portion of the active regions AA of the display panel 100 adjacent to each of ends of the first and second extension portions 456 and 458 may be reduced. In an exemplary embodiment, a light leakage problem at the active region AA of the display panel 100 generated by the thermal compression process may be reduced, for example.

In particular, the first surfaces 457 and 455 of the first and second extension portions 456 and 458 facing the active region AA of the display panel 100 may be broader such that a stress generated by a thermal compression process is moderated.

Because the stress generated by the thermal compression process is applied to a portion of the active region AA of the display panel 100 adjacent to the ends of the first and second extension portions 456 and 458, the first and second extension portions 456 and 458 may be substantially spaced apart from the active region AA of the display panel 100, and the data driving chip 450 may be positioned to be close to the active region AA of the display panel 100, simultaneously. A bezel of the display panel 100 may become narrow.

Figure 10:
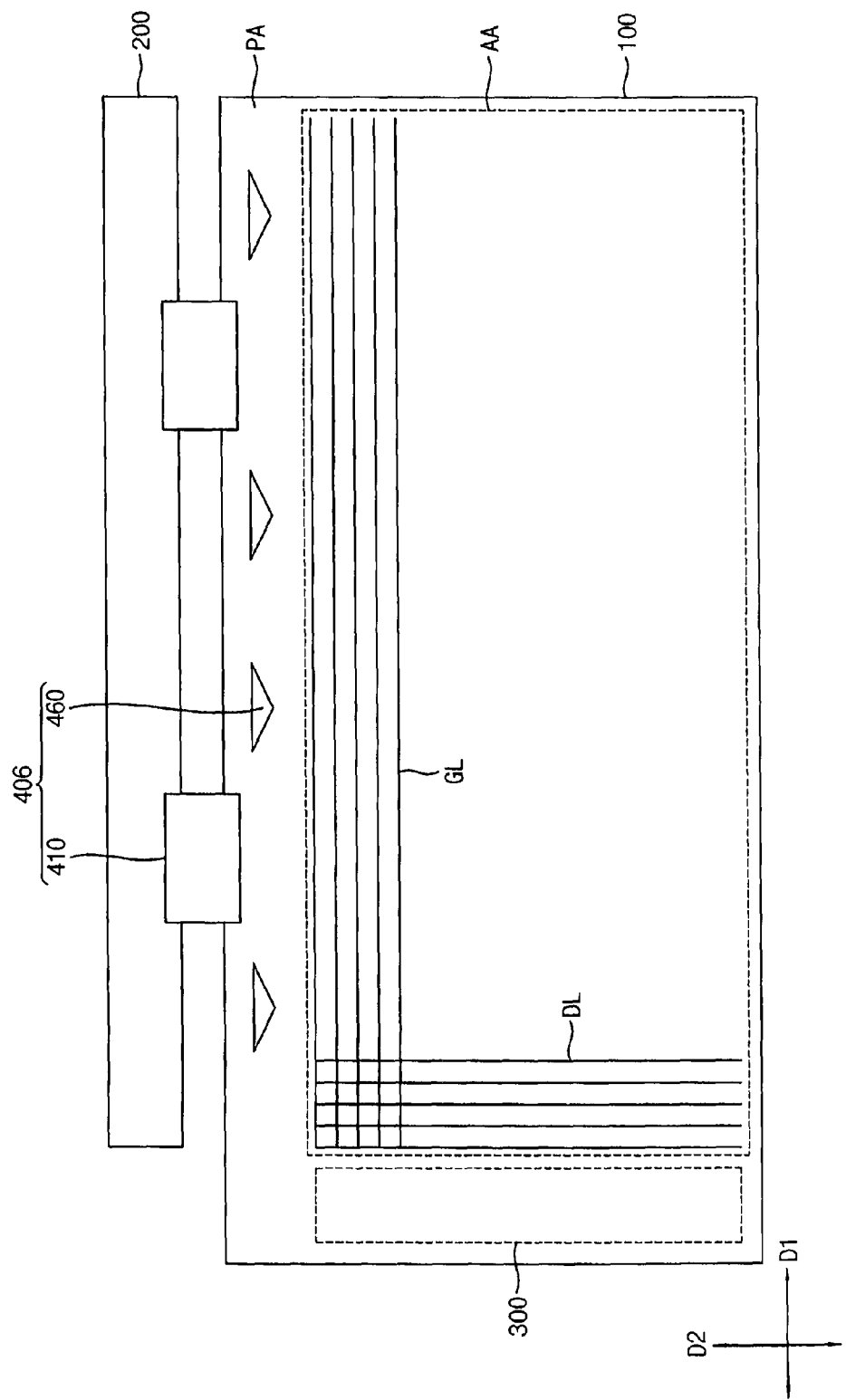
FIG. 10 is a plan view illustrating exemplary embodiments of a display apparatus according to the invention.
Figure 11:
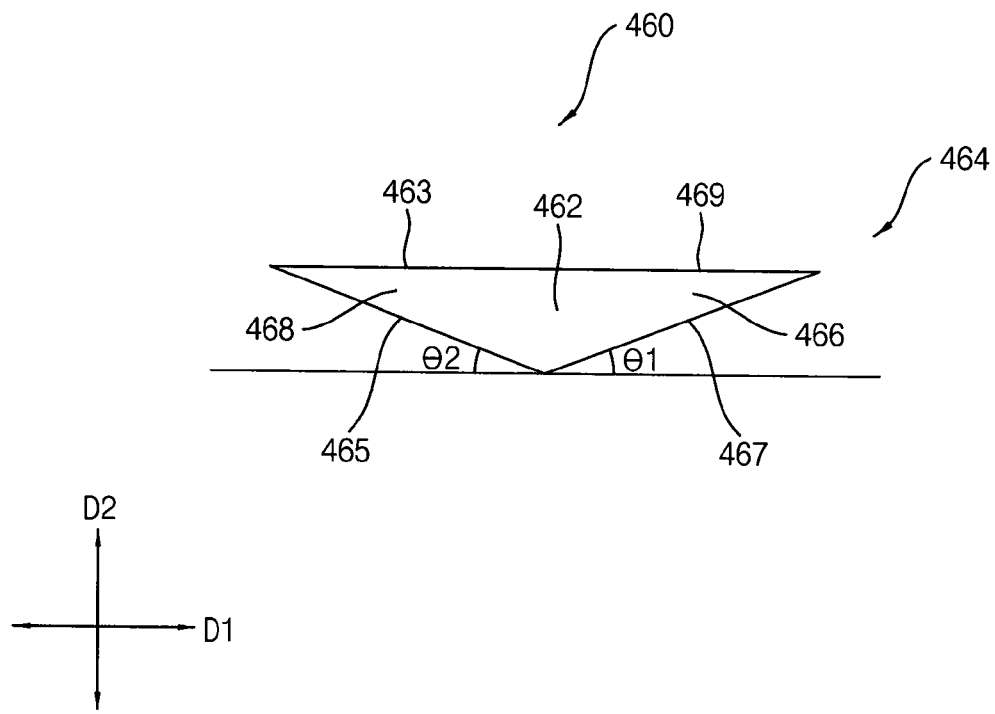
FIG. 11 is a plan view illustrating a data driving chip of FIG. 10.

FIG. 10 is a plan view illustrating a display apparatus according to exemplary embodiments. FIG. 11 is a plan view illustrating a data driving chip of FIG. 10. The display apparatus may be substantially the same as that of FIGS. 1 to 4, except for a shape of each of first and second extension portions. Thus like reference numerals refer to like elements, and repetitive explanations thereon may be omitted herein.

Referring to FIGS. 10 and 11, a display apparatus includes a display panel 100 and a display panel driver.

The display panel 100 includes an active region AA on which an image is displayed and the peripheral region PA adjacent to the active region AA and not displaying the image. The active region AA may be also referred to as a display region.

The display panel 100 includes a plurality of gate lines GL, each of which extends a first direction D1 and a plurality of data lines DL, a each of which extends a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

The display panel driver may include a gate driver 300 and a data driver 406. The display panel driver may further include a PCB 200. A timing controller and a power voltage generator may be disposed on the PCB 200.

The data driver 406 may include a plurality of data driving chips 460. The data driver 406 may further include a data flexible film 410.

The data driving chips 460 may be mounted on the peripheral region PA of the display panel 100. In an exemplary embodiment, the data driving chips 460 may be mounted on the peripheral region PA as a COG (chip on glass) type, for example. The data flexible film 410 may electrically connect the PCB 200 with the display panel 100.

In exemplary embodiments, the gate driver 300 may be mounted on the peripheral region PA of the display panel 100.

As illustrated in FIG. 11, each of the data driving chips 460 may include a chip body 462 and a stress reliever 464 extending from the chip body 462 in a direction, which may be an acute angle to the first and second direction D1 and D2.

The stress reliever 464 may include a first extension portion 466 and a second extension portion 468. A side (e.g., a lower side) of the first extension portion 466 may extend in a first angle $\theta 1$, which may be an acute angle to the first and second directions D1 and D2. A side (e.g., a lower side) of the second extension portion 468 may extend in a second angle $\theta 2$, which may be acute angle to the first and second directions D1 and D2.

In exemplary embodiments, each of first surfaces 467 and 465 of the first and second extension portions 466 and 468 may face the active region AA of the display panel 100. Each of the first surfaces 467 and 465 of the first and second extension portions 466 and 468 may extend in a direction, the direction which is an acute angle to the first and second directions D1 and D2. Each of second surfaces 469 and 463 of the first and second extension portions 466 and 468 may be opposite to each of the first surfaces 467 and 465 of the first and second extension portions 466 and 468, and each of the second surfaces 469 and 463 of the first and second extension portions 466 and 468 may be substantially parallel with the first direction D1.

In an exemplary embodiment, each of the data driving chips 460 may have a triangle shape.

In addition, the first and second extension portions 466 and 468 may be symmetric with respect to the chip body 462.

By the display apparatus according to exemplary embodiments, when a thermal compression process is performed to mount the data driving chip 460 on the peripheral region PA of the display panel 100, defects at a portion of the active regions AA of the display panel 100 adjacent to each of ends of the first and second extension portions 466 and 468 may be reduced. In an exemplary embodiment, a light leakage problem at the active region AA of the display panel 100 generated by the thermal compression process may be reduced, for example.

In particular, the first surfaces 467 and 465 of the first and second extension portions 466 and 468 facing the active region AA of the display panel 100 may be broader such that a stress generated by a thermal compression process is moderated.

Because the stress generated by the thermal compression process is applied to a portion of the active region AA of the display panel 100 adjacent to the ends of the first and second extension portions 466 and 468, the first and second extension portions 466 and 468 may be substantially spaced apart from the active region AA of the display panel 100, and the data driving chip 460 may be positioned to be close to the active region AA of the display panel 100, simultaneously. A bezel of the display panel 100 may become narrow.

Figure 12:
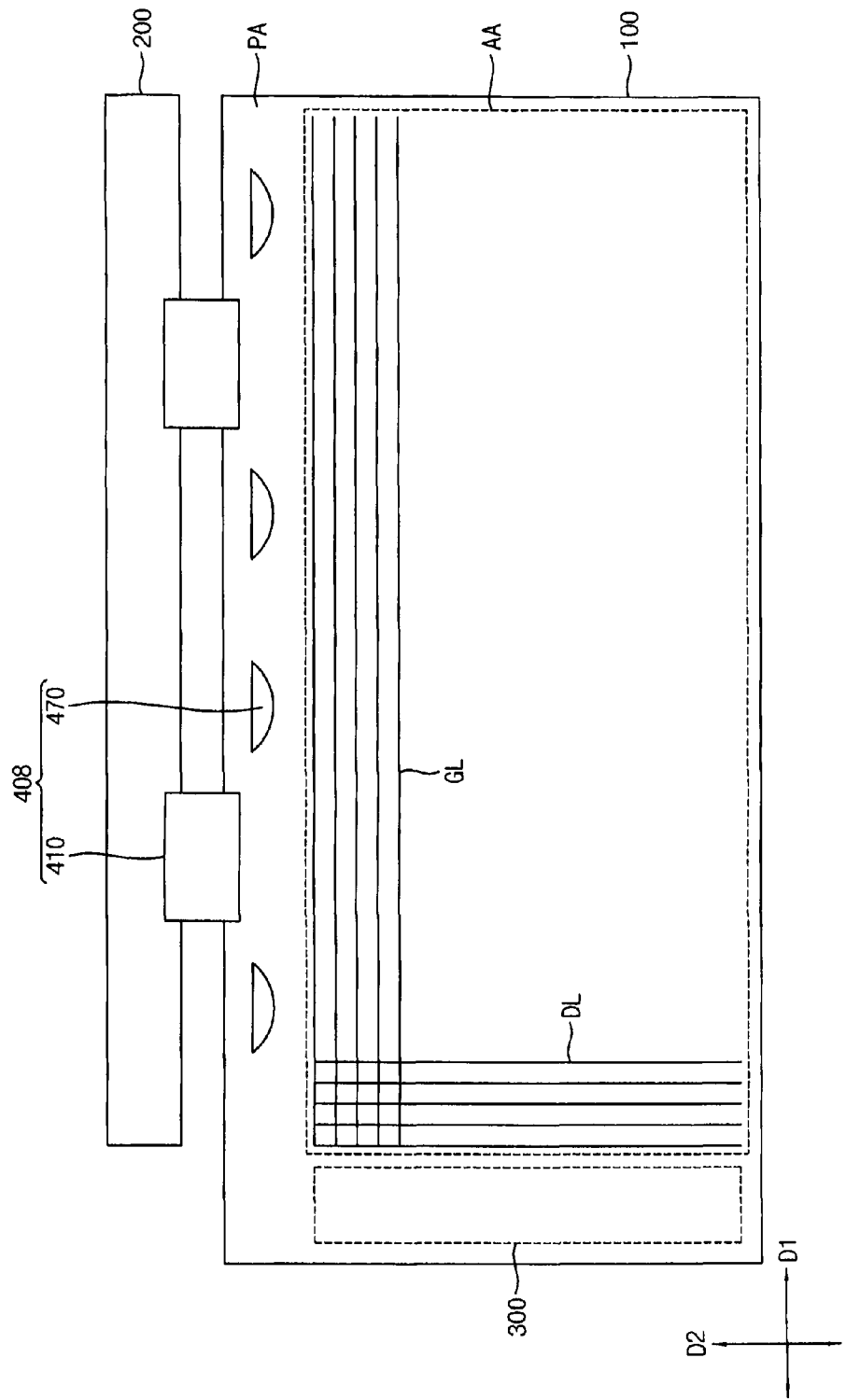
FIG. 12 is a plan view illustrating exemplary embodiments of a display apparatus according to the invention.

FIG. 12 is a plan view illustrating a display apparatus according to exemplary embodiments. FIG. 13 is a plan view illustrating a data driving chip of FIG. 12. The display apparatus may be substantially the same as that of FIGS. 1 to 4, except for a shape of each of first and second extension portions. Thus like reference numerals refer to like elements, and repetitive explanations thereon may be omitted herein.

Referring to FIGS. 12 and 13, a display apparatus includes a display panel 100 and a display panel driver.

The display panel 100 includes an active region AA on which an image is displayed and the peripheral region PA adjacent to the active region AA and not displaying the image. The active region AA may be also referred to as a display region.

The display panel 100 includes a plurality of gate lines GL, each of which extends a first direction D1 and a plurality of data lines DL, a each of which extends a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

The display panel driver may include a gate driver 300 and a data driver 408. The display panel driver may further include a PCB 200. A timing controller and a power voltage generator may be disposed on the PCB 200.

The data driver 408 may include a plurality of data driving chips 470. The data driver 408 may further include a data flexible film 410.

The data driving chips 470 may be mounted on the peripheral region PA of the display panel 100. In an exemplary embodiment, the data driving chips 470 may be mounted on the peripheral region PA as a COG (chip on glass) type, for example. The data flexible film 410 may electrically connect the PCB 200 with the display panel 100.

In exemplary embodiments, the gate driver 300 may be mounted on the peripheral region PA of the display panel 100.

As illustrated in FIG. 13, each of the data driving chips 470 may include a chip body 472 and a stress reliever 474 extending from the chip body 472 in a direction, which may be an acute angle to the first and second direction D1 and D2.

The stress reliever 474 may include a first extension portion 476 and a second extension portion 478. A tangent line of a side of the first extension portion 476 may have a first angle $\theta 1$, which may be an acute angle to the first and second directions D1 and D2. A tangent line of a side of the second extension portion 478 may have a second angle $\theta 2$, which may be acute angle to the first and second directions D1 and D2.

In exemplary embodiments, each of first surfaces 477 and 475 of the first and second extension portions 476 and 478 may face the active region AA of the display panel 100. Each of the first surfaces 477 and 475 of the first and second extension portions 476 and 478 may extend in a direction, the direction which is an acute angle to the first and second directions D1 and D2. Each of second surfaces 479 and 473 of the first and second extension portions 476 and 478 may be opposite to each of the first surfaces 477 and 475 of the first and second extension portions 476 and 478, and each of the second surfaces 479 and 473 of the first and second extension portions 476 and 478 may be substantially parallel with the first direction D1.

In an exemplary embodiment, each of the data driving chips 470 may have a semicircle shape, for example.

In an exemplary embodiment, the first and second extension portions 476 and 478 may be symmetric with respect to the chip body 472.

By the display apparatus according to exemplary embodiments, when a thermal compression process is performed to mount the data driving chip 470 on the peripheral region PA of the display panel 100, defects at a portion of the active regions AA of the display panel 100 adjacent to each of ends of the first and second extension portions 476 and 478 may be reduced. In an exemplary embodiment, a light leakage problem at the active region AA of the display panel 100 generated by the thermal compression process may be reduced, for example.

In particular, the first surfaces 477 and 475 of the first and second extension portions 476 and 478 facing the active region AA of the display panel 100 may be broader such that a stress generated by a thermal compression process is moderated.

Because the stress generated by the thermal compression process is applied to a portion of the active region AA of the display panel 100 adjacent to the ends of the first and second extension portions 476 and 478, the first and second extension portions 476 and 478 may be substantially spaced apart from the active region AA of the display panel 100, and the data driving chip 470 may be positioned to be close to the active region AA of the display panel 100, simultaneously. A bezel of the display panel 100 may become narrow.

Figure 14:
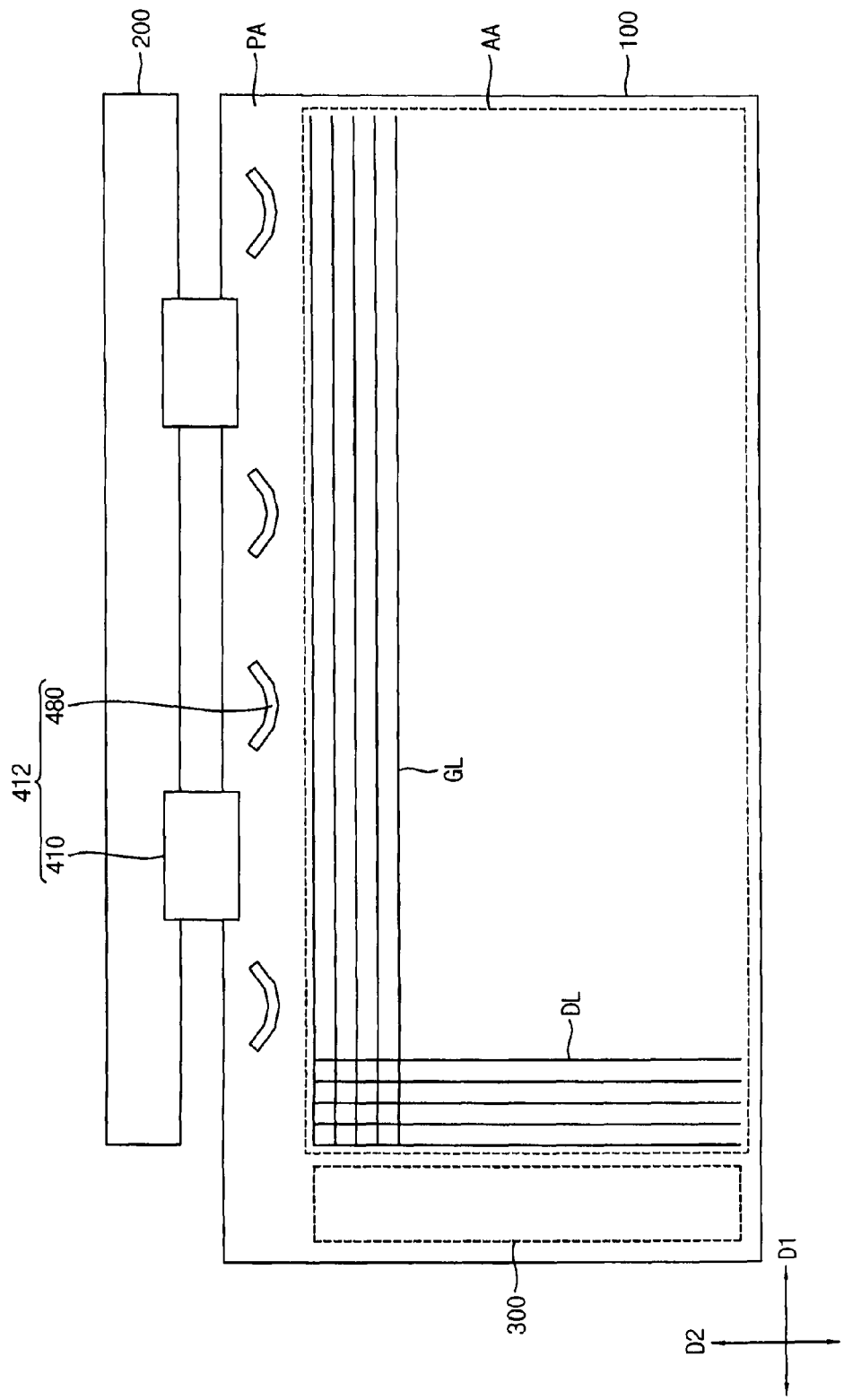
FIG. 14 is a plan view illustrating exemplary embodiments of a display apparatus according to the invention.
Figure 15:
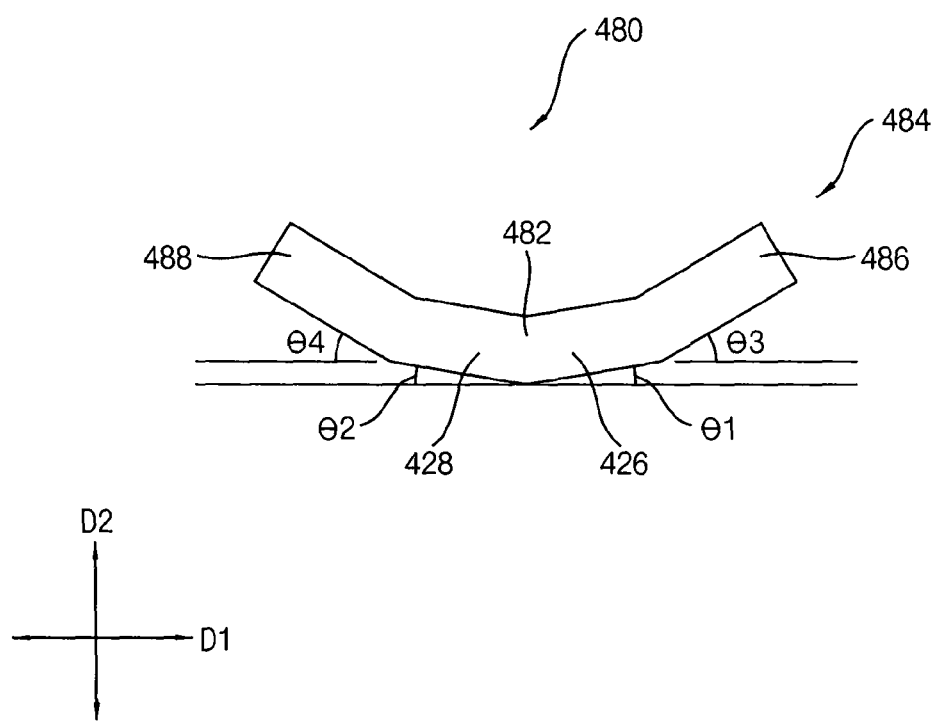
FIG. 15 is a plan view illustrating a data driving chip of FIG. 14.

FIG. 14 is a plan view illustrating a display apparatus according to exemplary embodiments. FIG. 15 is a plan view illustrating a data driving chip of FIG. 14. The display apparatus may be substantially the same as that of FIGS. 1 to 4, except for third and fourth extension portions. Thus like reference numerals refer to like elements, and repetitive explanations thereon may be omitted herein.

Referring to FIGS. 14 and 15, a display apparatus includes a display panel 100 and a display panel driver.

The display panel 100 includes an active region AA on which an image is displayed and the peripheral region PA adjacent to the active region AA and not displaying the image. The active region AA may be also referred to as a display region.

The display panel 100 includes a plurality of gate lines GL, each of which extends a first direction D1 and a plurality of data lines DL, a each of which extends a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

The display panel driver may include a gate driver 300 and a data driver 412. The display panel driver may further include a PCB 200. A timing controller and a power voltage generator may be disposed on the PCB 200.

The data driver 412 may include a plurality of data driving chips 480. The data driver 412 may further include a data flexible film 410.

The data driving chips 480 may be mounted on the peripheral region PA of the display panel 100. In an exemplary embodiment, the data driving chips 480 may be mounted on the peripheral region PA as a COG (chip on glass) type, for example. The data flexible film 410 may electrically connect the PCB 200 with the display panel 100.

In exemplary embodiments, the gate driver 300 may be mounted on the peripheral region PA of the display panel 100.

As illustrated in FIG. 15, each of the data driving chips 480 may include a chip body 482 and a stress reliever 484 extending from the chip body 482 in a direction, which may be an acute angle to the first and second direction D1 and D2.

The stress reliever 484 may include a first extension portion 426 and a second extension portion 428. The first extension portion 426 may extend in a first angle θ1, which may be an acute angle to the first and second directions D1 and D2. The second extension portion 428 may extend in a second angle θ2, which may be acute angle to the first and second directions D1 and D2.

The stress reliever 484 may further include a third extension portion 486 and a fourth extension portion 488. The third extension portion 486 may extend in a third angle θ3, which may be an acute angle to the first and second directions D1 and D2. The fourth extension portion 488 may extend in a fourth angle θ4, which may be acute angle to the first and second directions D1 and D2.

In exemplary embodiments, each of the third and fourth angles θ3 and θ4 may be greater than each of the first and second angles θ1 and θ2 with respect to the first direction D1.

Each of first ends of the third and fourth extension portions 486 and 488 may extend from each of the first and second extension portions 426 and 248. A distance between the active region AA of the display panel 100 and each of second ends of the third and fourth extension 486 and 488 may be greater than a distance between the active region AA of the display panel 100 and each of the first ends of the third and fourth extension portions 486 and 488.

In an exemplary embodiment, the first and second extension portions 426 and 428 may be symmetric with respect to the chip body 482. The third and fourth extension portions 486 and 488 may be symmetric with respect to the chip body 482.

By the display apparatus according to exemplary embodiments, when a thermal compression process is performed to mount the data driving chip 480 on the peripheral region PA of the display panel 100, defects at a portion of the active regions AA of the display panel 100 adjacent to each of the second ends of the third and fourth extension portions 486 and 488 may be reduced. In an exemplary embodiment, a light leakage problem at the active region AA of the display panel 100 generated by the thermal compression process may be reduced, for example.

Because the stress generated by the thermal compression process is applied to a portion of the active region AA of the display panel 100 adjacent to the second ends of the third and fourth extension portions 486 and 488, the third and fourth extension portions 486 and 488 may be substantially spaced apart from the active region AA of the display panel 100, and the data driving chip 480 may be positioned to be close to the active region AA of the display panel 100, simultaneously. A bezel of the display panel 100 may become narrow.

Figure 16:
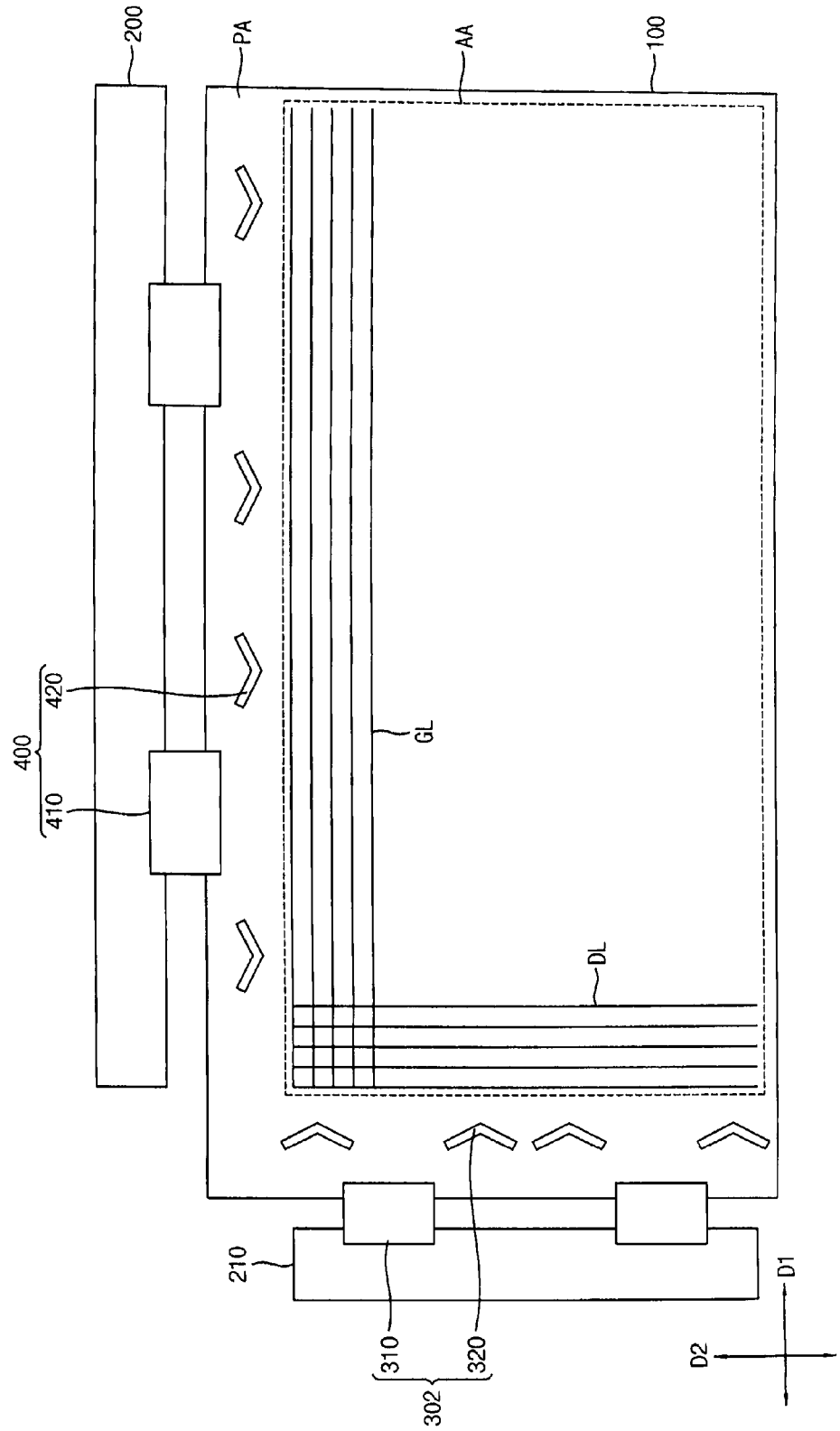
FIG. 16 is a plan view illustrating exemplary embodiments a display apparatus according to the invention.
Figure 17:
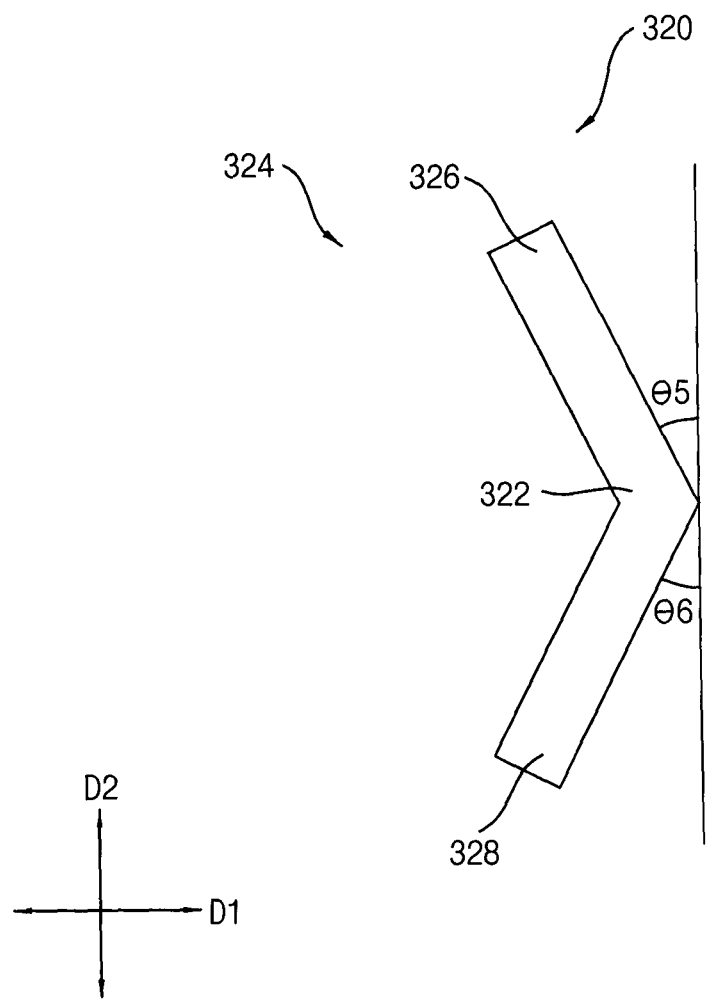
FIG. 17 is a plan view illustrating a gate driving chip of FIG. 16.

FIG. 16 is a plan view illustrating a display apparatus according to exemplary embodiments. FIG. 17 is a plan view illustrating a gate driving chip of FIG. 16. The display apparatus may be substantially the same as that of FIGS. 1 to 4, except for a gate driver. Thus like reference numerals refer to like elements, and repetitive explanations thereon may be omitted herein.

Referring to FIGS. 16 and 17, a display apparatus includes a display panel 100 and a display panel driver.

The display panel 100 includes an active region AA on which an image is displayed and the peripheral region PA adjacent to the active region AA and not displaying the image. The active region AA may be also referred to as a display region.

The display panel 100 includes a plurality of gate lines GL, each of which extends a first direction D1 and a plurality of data lines DL, a each of which extends a second direction D2 crossing the first direction D1. The display panel 100 includes a plurality of pixels. The pixels are electrically connected to the gate lines GL and the data lines DL. The gate lines GL, the data lines DL and the pixels are disposed in the active region AA of the display panel 100.

The display panel driver may include a gate driver 302 and a data driver 400. The display panel driver may further include a first PCB 200 and a second PCB 210. A timing controller and a power voltage generator may be disposed on the first PCB 200.

The data driver 400 may include a plurality of data driving chips 420. The data driver 400 may further include a data flexible film 410.

The data driving chips 420 may be mounted on the peripheral region PA of the display panel 100. In an exemplary embodiment, the data driving chips 420 may be mounted on the peripheral region PA as a COG (chip on glass) type, for example. The data flexible film 410 may electrically connect the first PCB 200 with the display panel 100.

The gate driver 302 may include a plurality of gate driving chips 320. The gate driver 302 may further include a gate flexible film 310.

The gate driving chips 320 may be mounted on the peripheral region PA of the display panel 100. In an exemplary embodiment, the gate driving chips 320 may be mounted on the peripheral region PA as a COG (chip on glass) type, for example. The gate flexible film 310 may electrically connect the second PCB 210 with the display panel 100.

Referring back to FIGS. 2 and 3, each of the data driving chips 420 may include a chip body 422 and a stress reliever 424 extending from the chip body 422 in a direction, which may be an acute angle to the first and second direction D1 and D2.

The stress reliever 424 may include a first extension portion 426 and a second extension portion 428. The first extension portion 426 may extend in a first angle θ1, which may be an acute angle to the first and second directions D1 and D2. The second extension portion 428 may extend in a second angle θ2, which may be acute angle to the first and second directions D1 and D2.

In exemplary embodiments, the data driving chip 420 may have a V shape. In an exemplary embodiment, the first and second extension portions 426 and 428 may be symmetric with respect to the chip body 422.

In exemplary embodiments, the chip body 422 may extend in the first direction D1.

Similarly, as illustrated in FIG. 17, each of the gate driving chips 320 may include a chip body 322 and a stress reliever 324 extending from the chip body 322 in a direction, which may be an acute angle to the first and second direction D1 and D2.

The stress reliever 324 may include a first extension portion 326 and a second extension portion 328. The first extension portion 326 may extend in a fifth angle θ5, which may be an acute angle to the first and second directions D1 and D2. The second extension portion 328 may extend in a sixth angle θ6, which may be acute angle to the first and second directions D1 and D2.

In exemplary embodiments, the gate driving chip 320 may have a V shape. In an alternative exemplary embodiment, the gate driving chip 320 may have a U shape.

In an exemplary embodiment, the first and second extension portions 326 and 328 may be symmetric with respect to the chip body 322. In exemplary embodiments, the chip body 322 may extend in the second direction D2.

By the display apparatus according to exemplary embodiments, when a thermal compression process is performed to mount the data driving chip 420 and the gate driving chip 320 on the peripheral region PA of the display panel 100, defects at a portion of the active regions AA of the display panel 100 adjacent to each of ends of the first and second extension portions 426 and 488 of the data driving chip 420 and the first and second extension portions 326 and 328 of the gate driving chip 320 may be reduced. In an exemplary embodiment, a light leakage problem at the active region AA of the display panel 100 generated by the thermal compression process may be reduced, for example.

Because the stress generated by the thermal compression process is applied to a portion of the active region AA of the display panel 100 adjacent to the ends of the first and second extension portions 426 and 488 of the data driving chip 420 and the first and second extension portions 326 and 328 of the gate driving chip 320, the first and second extension portions 426 and 488 of the data driving chip 420 and the first and second extension portions 326 and 328 of the gate driving chip 320 may be substantially spaced apart from the active region AA of the display panel 100, respectively, and the data driving chip 420 and the gate driving chip 320 may be positioned to be close to the active region AA of the display panel 100, simultaneously. Accordingly, a bezel of the display panel 100 may become narrow.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages of the invention. Accordingly, all such modifications are intended to be included within the scope of exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A display apparatus comprising:
   a display panel comprising a first substrate and a second substrate opposite to the first substrate, the first substrate comprising a switching element and a pixel electrode electrically connected to the switching element; and
   a display panel driver comprising:
   a gate driver which outputs a gate signal to a gate line of the display panel, the gate line electrically connected to the switching element and extending in a first direction; and
   a data driver which outputs a data signal to a data line of the display panel and comprising a plurality of data driving chips, the data line electrically connected to the switching element and extending in a second direction crossing the first direction,
   wherein each of the plurality of data driving chips comprises:
   a first portion extending in a first angle to the first direction; and
   a second portion extending in a second angle to a third direction which is opposite to the first direction, wherein a first end of the second portion is connected to a first end of the first portion, and wherein the first angle and the second angle are acute angles.

2. The display apparatus of claim 1,
wherein the display panel includes an active region in which the gate line and the data line are disposed and a peripheral region in which the plurality of data driving chips are disposed, and
wherein a distance between each of second ends of the first and second portions and the active region of the display panel is greater than a distance between each of the first ends of the first and second portions and the active region of the display panel.

3. The display apparatus of claim 1, wherein each of the plurality of data driving chips has a V shape.

4. The display apparatus of claim 1, wherein each of the plurality of data driving chips has a U shape.

5. The display apparatus of claim 1, wherein the first and second portions are substantially symmetric with respect to the second direction.

6. The display apparatus of claim 1, wherein the display panel includes an active region in which the gate line and the data line are disposed and a peripheral region in which the plurality of data driving chips are disposed,
wherein each of first surfaces of the first and second portions faces the active region of the display panel,
wherein each of the first surface of the first and second portions extends in a direction, the direction which is an acute angle to the first and second directions, and
wherein each of second surfaces of the first and second portions is opposite to each of the first surfaces of the first and second portions, and each of the second surfaces of the first and second portions is substantially parallel with the first direction.

7. The display apparatus of claim 6, wherein each of the plurality of data driving chips has a shape in which portions of two adjacent corners of a rectangle are removed.

8. The display apparatus of claim 6, wherein each of the plurality of data driving chips has a triangle shape.

9. The display apparatus of claim 6, wherein each of the plurality of data driving chips has a semicircle shape.

10. The display apparatus of claim 1, wherein each of the plurality of data driving chips includes a third portion extending from the first portion in a third angle to the first direction and a fourth portion extending from the second portion in a fourth angle to the first direction, and
wherein each of the third and fourth angles is different from each of the first and second angles.

11. The display apparatus of claim 10, wherein each of the third and fourth angles is greater than each of the first and second angles with respect to the first direction.

12. The display apparatus of claim 10, wherein the display panel includes an active region in which the gate line and the data line are disposed and a peripheral region in which the plurality of data driving chips are disposed,
wherein each of first ends of the third and fourth portions is connected to each of the first and second portions, and
wherein a distance between each of second ends of the third and fourth portions and the active region of the display panel is greater than a distance between each of the first ends of the third and fourth portions and the active region of the display panel.

13. The display apparatus of claim 12, wherein the third and fourth portions are symmetric with respect to the second direction.

14. The display apparatus of claim 1, wherein each of the plurality of data driving chips is disposed on the first substrate.

15. The display apparatus of claim 1, wherein the display panel driver further includes a printed circuit board and the data driver further includes a flexible film electrically connecting the printed circuit board with the display panel.

16. The display apparatus of claim 1, wherein the gate driver includes a plurality of gate driving chips,
wherein each of the plurality of gate driving chips includes a fifth portion extending in a fifth angle to the second direction and a sixth portion extending in a sixth angle to the second direction, and
wherein a first end of the sixth portion is connected to a first end of the fifth portion.

17. The display apparatus of claim 16, wherein each of the plurality of gate driving chips has a V shape.

18. The display apparatus of claim 16, wherein each of the plurality of gate driving chips has a U shape.

* * * * *